(12) United States Patent
Lin (10) Patent No.: US 6,869,834 B2
(45) Date of Patent: Mar. 22, 2005

(54) METHOD OF FORMING A LOW TEMPERATURE POLYSILICON THIN FILM TRANSISTOR

(75) Inventor: Hui-Chu Lin, Hsin-Chu Hsien (TW)

(73) Assignee: Toppoly Optoelectronics Corp., Miao-Li Hsien (TW)

( * ) Notice: Subject to any disclaimer, the term of this patent is extended or adjusted under 35 U.S.C. 154(b) by 101 days.

(21) Appl. No.: 10/248,770

(22) Filed: Feb. 16, 2003

(65) Prior Publication Data

US 2004/0072392 A1 Apr. 15, 2004

(30) Foreign Application Priority Data

Oct. 9, 2002 (TW) .................................. 91123032 A (51) Int. Cl.[7] .......................... H01L 21/00; H01L 21/84
(52) U.S. Cl. ...................................... 438/164; 438/158
(58) Field of Search ............................... 438/164, 158, 438/216, 287, 788, 792

(56) References Cited

U.S. PATENT DOCUMENTS

| 4,112,507 | A | * | 9/1978 | White et al. ................ 365/184 |
| 5,322,807 | A | * | 6/1994 | Chen et al. .................. 438/166 |
| 5,663,077 | A | * | 9/1997 | Adachi et al. ............... 438/151 |
| 5,719,065 | A | * | 2/1998 | Takemura et al. ........... 438/163 |
| 5,795,821 | A | * | 8/1998 | Bacchetta et al. ........... 438/624 |
| 5,885,858 | A | * | 3/1999 | Nishimura et al. .......... 438/149 |
| 5,897,345 | A | * | 4/1999 | Uochi ........................ 438/151 |
| 6,506,636 | B2 | * | 1/2003 | Yamazaki et al. ........... 438/149 |
| 2001/0002325 | A1 | * | 5/2001 | Oda et al. ................... 438/158 |
| 2003/0094616 | A1 | * | 5/2003 | Andry et al. ................. 257/72 |

* cited by examiner

Primary Examiner—Matthew Smith
Assistant Examiner—Lex H. Malsawma
(74) Attorney, Agent, or Firm—Winston Hsu (57) ABSTRACT

The present invention provides a method of forming a low temperature polysilicon thin film transistor (LTPS TFT). A polysilicon layer including a channel region is formed first. A first and a second plasma enhanced chemical vapor deposition processes are sequentially performed to form a composite gate insulating layer composed of a TEOS-based silicon oxide layer and a silicon nitride layer on the channel region. Finally a gate electrode and a source/drain of the low temperature polysilicon thin film transistor are formed.

34 Claims, 14 Drawing Sheets

METHOD OF FORMING A LOW TEMPERATURE POLYSILICON THIN FILM TRANSISTOR

BACKGROUND OF INVENTION

1. Field of the Invention

The present invention relates to a method of fabricating a low temperature polysilicon thin film transistor (LTPS TFT), and more particularly, to a method of fabricating a low temperature polysilicon thin film transistor with good electrical characteristics and good reliability performance.

2. Description of the Prior Art

Nowadays, a liquid crystal display (LCD) is the most mature flat panel display technique. The applications for a liquid crystal display are extensive, such as mobile phones, digital cameras, video cameras, notebooks, and monitors. Due to the high vision quality requirements and the expansion of new application fields, the LCD is developed toward high quality, high resolution, high brightness, and low price. The low temperature polysilicon thin film transistor (LTPS TFT), having a character of being actively driven, is a break-through in achieving the above objective.

Please refer to FIG. 1 to FIG. 4. FIG. 1 to FIG. 4 are schematic diagrams of fabricating a low temperature polysilicon thin film transistor 26 according to the prior art. The prior art low temperature polysilicon thin film transistor 26 is fabricated on an insulation substrate 10. The insulation substrate 10, composed of transparent materials, may be a glass substrate or a quartz substrate.

Figure 1:
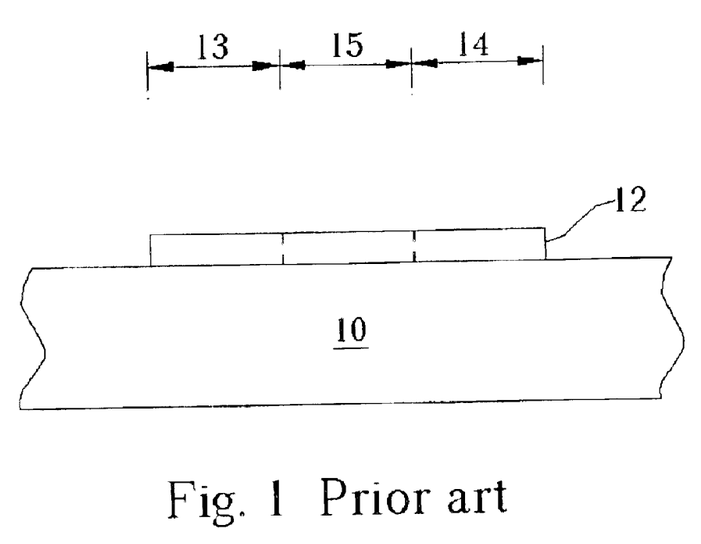
FIG. 1 to FIG. 4 are schematic diagrams of fabricating a low temperature polysilicon thin film transistor according to the prior art.

Referring to FIG. 1, an amorphous silicon thin film (α-Si thin film, not shown) is formed on a surface of the insulation substrate 10 first. Then an excimer laser annealing (ELA) process is performed to re-crystallize the amorphous silicon thin film (not shown) into a polysilicon layer 12. A source region 13, a drain region 14, and a channel region 15 are comprised on a surface of the polysilicon layer 12.

Since the quality of the amorphous silicon thin film (not shown) is a determinative factor for the characteristics of the subsequent formed polysilicon layer 12, all of the parameters during the amorphous silicon thin film deposition process need to be strictly controlled. The amorphous silicon thin film with low hydrogen content, high thickness uniformity, and low surface roughness is thus formed. Moreover, the amorphous silicon thin film is melted and re-crystallized rapidly through absorption of the deep ultraviolet light during the excimer laser annealing process to form the polysilicon layer 12. Such a quick absorption due to the short laser pulse only affects the surface of the amorphous silicon thin film and will not affect the insulation substrate 10. Hence, the insulation substrate 10 is kept at a low temperature state.

Figure 2:
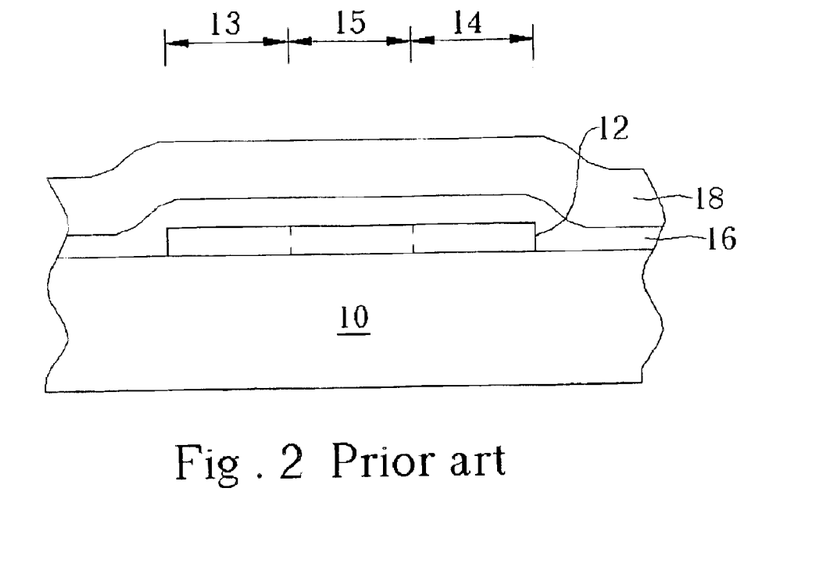

As shown in FIG. 2, a plasma enhanced chemical vapor deposition (PECVD) process is thereafter performed to form a silicon oxide layer ($SiO_x$ layer, x≈2) 16 having a thickness of 500~1200 angstrom (Å) on the surface of the polysilicon layer 12. Since the molecules of the participating gases, such as silane ($SiH_4$) and nitrous oxide ($N_2O$), are dissociated into atoms, ions, or radicals by plasma to proceed the deposition reaction for the silicon oxide layer 16, the silicon oxide layer 16 is also called a silane-based silicon oxide ($SiH_4$ based $SiO_x$) layer. After that, a first sputtering process is performed to form a metal layer 18 on a surface of the silicon oxide layer 16. The metal layer 18 may be a tungsten (W) layer, a chrome (Cr) layer, or another conductive metal layer.

Figure 3:
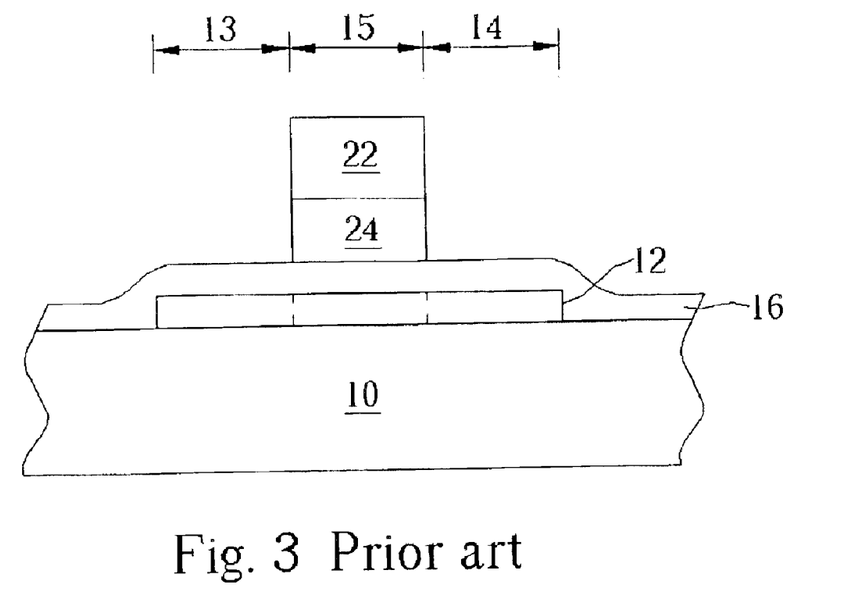

As shown in FIG. 3, then a photoresist layer (not shown) is formed on the surface of the insulation substrate 10. A photolithography process is thereafter performed to define a gate pattern 22 in the photoresist layer (not shown). The gate pattern 22 is on top of the channel region 15. After that, a dry etch process is performed to remove portions of the metal layer 18 so as to form a gate 24 on top of the silicon oxide layer 16. The silicon oxide layer 16 is used as a gate insulating layer of the low temperature polysilicon thin film transistor.

Figure 4:
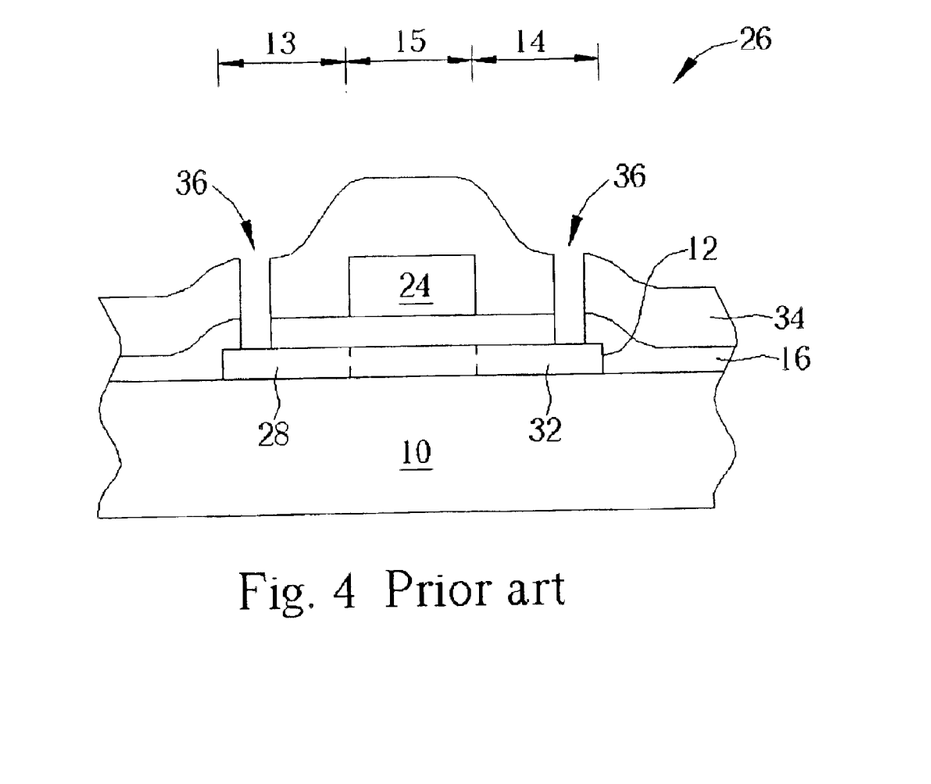

After removing the gate pattern 22, an ion implantation process is then performed to form a source 28 and a drain 32 of the low temperature polysilicon thin film transistor 26, in the source region 13, and in the drain region 14 in the polysilicon layer 12 respectively by utilizing the gate 24 as a mask, as shown in FIG. 4. In consideration to the application of the thin film transistor (TFT), the series resistance of the source/drain must be low. An activation process is thus necessarily performed after the ion implantation process to highly activate the dopants in the source 28 and the drain 32. The activation process not only moves the ions to the correct lattice sites but also repairs the lattice defects incurred from the ion implantation process to complete the fabrication of the low temperature polysilicon thin film transistor 26.

After completing the low temperature polysilicon thin film transistor 26 a dielectric layer 34 is deposited. The dielectric layer 34 may be a single-layered dielectric layer or a composite-layered dielectric layer. Finally a photo-etching-process (PEP) is performed to form a contact hole 36 from the dielectric layer 34 and the silicon oxide layer 16, on top of the source region 13 and the drain region 14, extending to the source 28 and the drain 32, respectively. The contact hole 36 is filled with conductive materials to electrically connect the source 28 and the drain 32 to the electrode of the capacitor and the signal line respectively, according to the circuit design.

However, the prior art method of fabricating a low temperature polysilicon thin film transistor 26 incurs a severe problem. The silane-based silicon oxide ($SiH_4$-based $SiO_x$) thin film, deposited by the PECVD process, contains an eminent amount of hydrogen (H). The hydrogen content is from 2~9 atomic % depending on the processing parameters. The hydrogen content comes from Si—H bonds, which form when a precursor in the plasma with a low dissociation temperature loses hydrogen atoms to unsaturated silicon (S) atoms. The diffusion velocity of hydrogen atoms is rapid due to their small size. As a result, the hydrogen atoms are readily diffused into the Si—$SiO_2$ interface. Owing to the discontinuous property of the Si—$SiO_2$ interface, H atoms are trapped in the Si—$SiO_2$ interface and become interface-trapped charges ($Q_{it}$). Basically, the interface trapped charges can be reduced by using an adequate annealing process. However, the interface traps cannot be eliminated completely.

Figure 5:
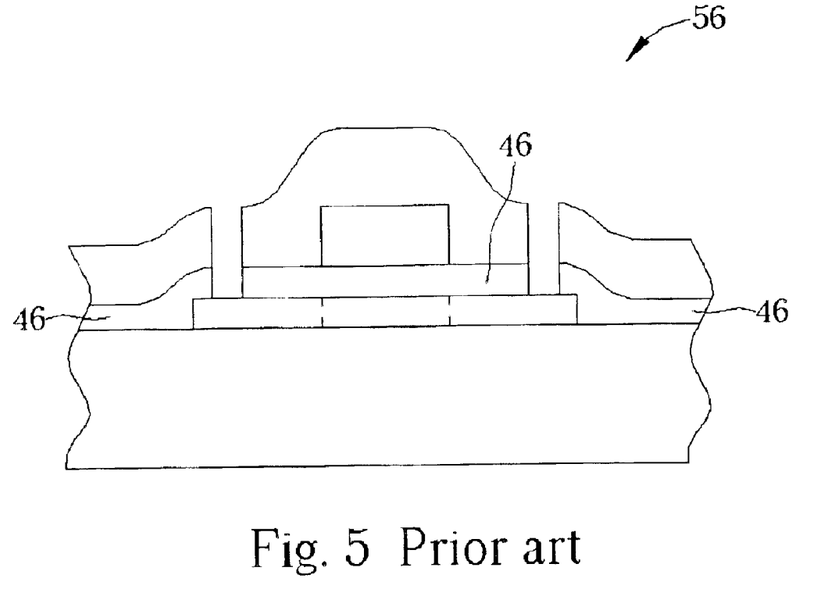
FIG. 5 is a schematic diagram of another low temperature polysilicon thin film transistor according to the prior art.

Please refer to FIG. 5 that is a schematic diagram of another low temperature polysilicon thin film transistor 56 according to the prior art. The prior art low temperature polysilicon thin film transistor 56 is similar to the low temperature polysilicon thin film transistor 26 in FIG. 4. The difference between them is the silicon oxide layer 16, used as the gate insulating layer in the low temperature polysilicon thin film transistor 56, is replaced with a tetra-ethyl-ortho-silicate based silicon oxide layer (TEOS-based $SiO_x$ layer) 46. The tetra-ethyl-ortho-silicate based silicon oxide layer 46 is a silicon oxide thin film deposited by PECVD by inputting tetra-ethyl-ortho-silicate (TEOS) and oxygen. The silicon oxide thin film 46, formed by this method, has better interface property than the silane-based silicon oxide thin film 16 deposited by the PECVD process. Moreover, the step coverage ability of the silicon oxide thin film, formed by this method, is better than the silane-based silicon oxide thin film deposited by the PECVD process.

Since the silicon oxide layer 46 in the low temperature polysilicon thin film transistor 56 is composed of the tetra-ethyl-ortho-silicate based silicon oxide, the interface property is obviously improved to inhibit the generation of the interface trapped charges. The flat band voltage ($V_{FB}$) for the low temperature polysilicon thin film transistor 56 is thus lowered. For any low temperature polysilicon thin film transistor, the threshold voltage ($V_t$) correlates closely to the flat band voltage. Therefore, the silicon oxide layer 46 composed of tetra-ethyl-ortho-silicate based silicon oxide improves the stability of the threshold voltage for the low temperature polysilicon thin film transistor 56 effectively. However, the breakdown field strength for the silicon oxide layer 46 is not high. In view of the device performance, this film is not ideal.

Figure 6:
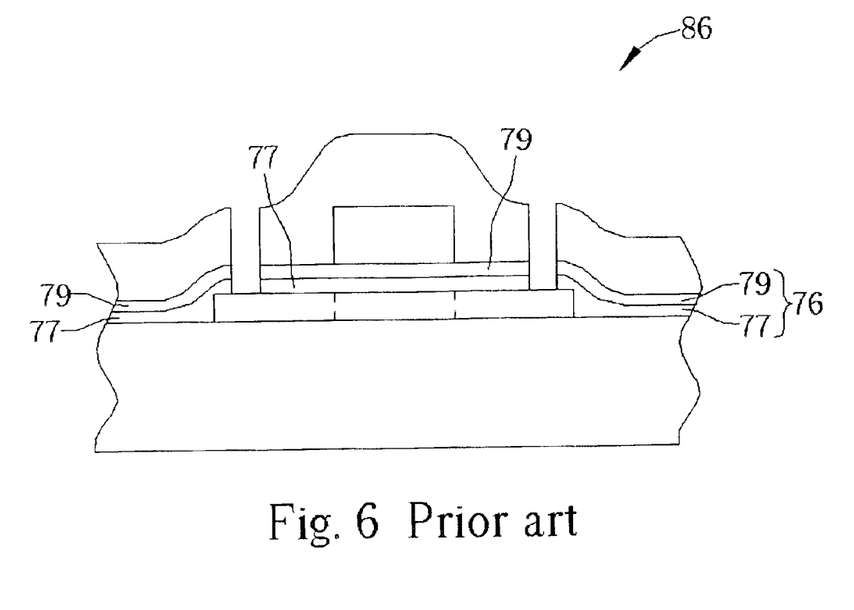
FIG. 6 is a schematic diagram of another low temperature polysilicon thin film transistor according to the prior art.

Please refer to FIG. 6. FIG. 6 is a schematic diagram of another low temperature polysilicon thin film transistor 86 according to the prior art. The prior art low temperature polysilicon thin film transistor 86 is also similar to the low temperature polysilicon thin film transistor 26 in FIG. 4. The difference between them is the gate insulating layer 76 is a composite layer composed of a silane-based silicon oxide layer 77 and a silicon nitride layer 79 in the low temperature polysilicon thin film transistor 86. A PECVD process is performed to form the silane-based silicon oxide layer 77. Another PECVD process is afterwards performed to form a silane-based silicon nitride ($SiH_4$-based $SiN_x$) layer 79 by inputting silane, ammonia ($NH_3$), and nitrogen ($N_2$) on a surface of the silicon oxide layer 77. In comparison with the silicon oxide thin film, the silicon nitride layer 79 has a better moisture barrier ability, a better metal ions barrier ability, and a higher breakdown field strength to endow the low temperature polysilicon thin film transistor 86 with better electrical characters and high reliability.

However, the prior art method of fabricating a low temperature polysilicon thin film transistor can not fabricate a low temperature polysilicon thin film transistor having a good interface property, a good threshold voltage stability, a good barrier ability for moisture and metal ions and a high breakdown voltage. Therefore, it is very important to fabricate a low temperature polysilicon thin film transistor with the above-mentioned advantage.

SUMMARY OF INVENTION

It is therefore an object of the claimed invention to provide a method of fabricating a low temperature polysilicon thin film transistor (LTPS TFT), especially a method of fabricating a low temperature polysilicon thin film transistor with better electrical characteristics and reliability.

According to the claimed invention, an insulation substrate is provided first. A polysilicon layer comprising a source region, a drain region, and a channel region is directly formed on a surface of the insulation substrate. Then a first and a second plasma enhanced chemical vapor deposition process are sequentially performed to form a composite gate insulating layer composed of a TEOS-based silicon oxide layer and a silicon nitride layer on the channel region. A gate electrode is thereafter formed on the composite gate insulating layer. Finally, an ion implantation process is performed to form a source electrode and a drain electrode in the polysilicon layer in the source region and the drain region, respectively, by utilizing the gate electrode as a mask to complete the fabrication of the low temperature polysilicon thin film transistor.

The method of fabricating the gate insulating layer of the present invention low temperature polysilicon thin film transistor is to utilize a plasma enhanced chemical vapor deposition process and tetra-ethyl-ortho-silicate to form a silicon oxide layer first. The Si—$SiO_2$ interface property is thus effectively improved to reduce the concentration of the interface trapped charges in the Si—$SiO_2$ interface. Additionally, a better step coverage ability is obtained. Then another plasma enhanced chemical vapor deposition process is performed to form a silicon nitride layer on the silicon oxide layer. Hence, the gate insulating layer of the present invention low temperature polysilicon thin film transistor has a better barrier ability to moisture and metal ions, and a higher breakdown field strength. Overall, not only the stability of the threshold voltage of the low temperature polysilicon thin film transistor is improved greatly, but the electrical performance and the reliability of device is effectively improved when applying the present invention method to the practical production line.

These and other objectives of the claimed invention will no doubt become obvious to those of ordinary skill in the art after having read the following detailed description of the preferred embodiment that is illustrated in the various figures and drawings.

DETAILED DESCRIPTION

Figure 7:
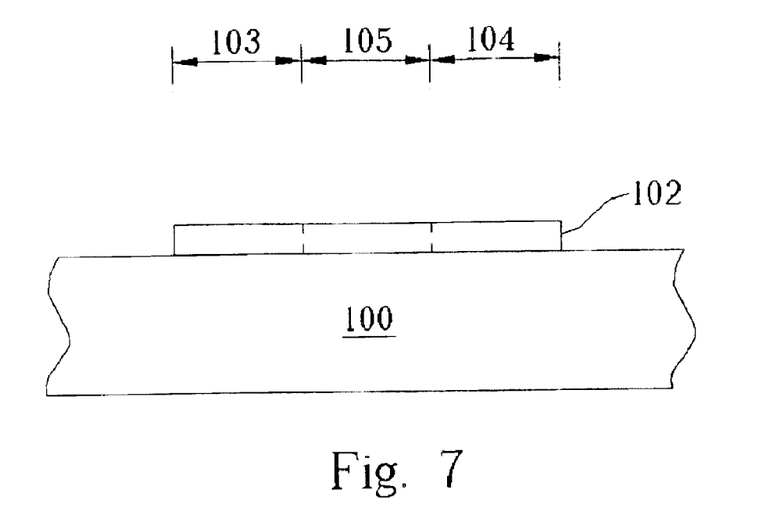
FIG. 7 to FIG. 10 are schematic diagrams of fabricating a low temperature polysilicon thin film transistor according to a first preferred embodiment of the present invention.

Please refer to FIG. 7 to FIG. 10. FIG. 7 to FIG. 10 are schematic diagrams of fabricating a low temperature polysilicon thin film transistor 122 according to a first preferred embodiment of the present invention. As shown in FIG. 7, the present invention low temperature polysilicon thin film transistor 122 is fabricated on an insulation substrate 100. The insulation substrate 100, composed of transparent materials, may be a glass substrate or a quartz substrate. An amorphous silicon thin film (α-Si thin film, not shown) is formed on a surface of the insulation substrate 100 first. Then an excimer laser annealing (ELA) process is performed to re-crystallize the amorphous silicon thin film (not shown) into a polysilicon layer 102. A source region 103, a drain region 104, and a channel region 105 are comprised on a surface of the polysilicon layer 102.

As mentioned before, since the quality of the amorphous silicon thin film (not shown) is a determinative factor for the characteristics of the subsequently formed polysilicon layer 102, all of the parameters during the amorphous silicon thin film deposition process need to be strictly controlled. The amorphous silicon thin film with low hydrogen content, high thickness uniformity, and low surface roughness is thus formed. Moreover, the amorphous silicon thin film is melted and re-crystallized rapidly through absorption of the deep ultraviolet light during the excimer laser annealing process to form the polysilicon layer 102. Such a quick absorption due to the short laser pulse only affects the surface of the amorphous silicon thin film and will not affect the insulation substrate 100. Hence, the insulation substrate 100 is kept at a low temperature state.

Figure 8:
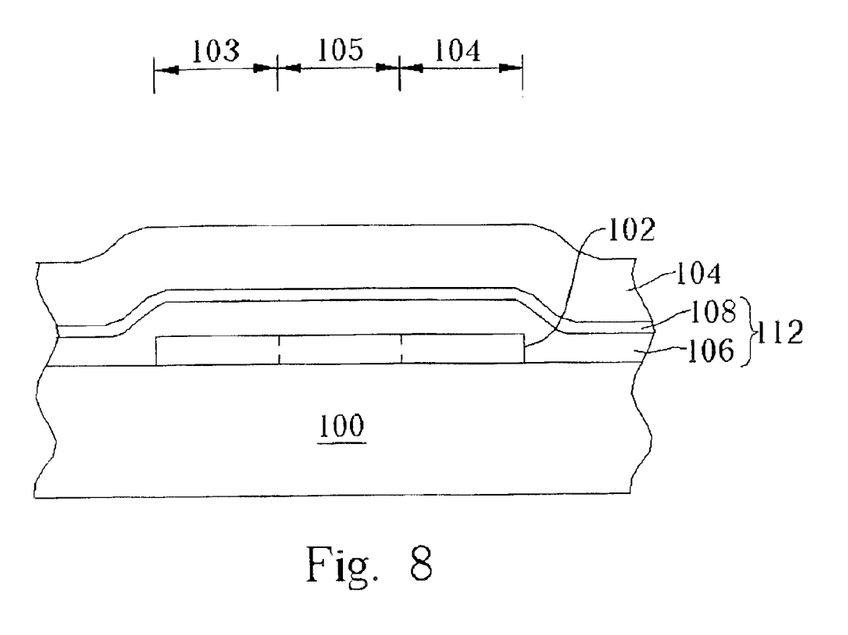

As shown in FIG. 8, a first plasma enhanced chemical vapor deposition (PECVD) process is thereafter performed. By inputting tetra-ethyl-ortho-silicate (TEOS) and oxygen, a tetra-ethyl-ortho-silicate based silicon oxide layer (TEOS-based $SiO_x$ layer), also called a silicon oxide layer ($SiO_x$ layer) 106 and having a thickness of 500~1200 angstrom (Å), is formed on the surface of the polysilicon layer 102. After that, a second plasma enhanced chemical vapor deposition process is performed by inputting silane, ammonia ($NH_3$), and nitrogen ($N_2$) to form a silicon nitride layer ($SiN_x$ layer, $1.0<x<1.6$), also shown in FIG. 8 as a silane-based silicon nitride layer ($SiH_4$-based $SiN_x$ layer) 108 and having a thickness of 100~500 angstrom (Å), on a surface of the silicon oxide layer 106. The tetra-ethyl-ortho-silicate based silicon oxide layer (TEOS-based $SiO_x$ layer, where $x \approx 2$) 106 and the silicon nitride layer 108 compose a composite gate insulating layer 112. The first plasma enhanced chemical vapor deposition process and the second plasma enhanced chemical vapor deposition process are performed in a single wafer type chamber continuously or in different single wafer type chambers.

Since the dielectric constant for the silicon nitride layer 108 is much higher than the dielectric constant for the silicon oxide layer 106, the present invention method can effectively avoid the overly high capacitance value of the gate insulating layer 112 by adjusting the thickness for the silicon oxide layer 106 to be greater than the silicon nitride layer 108. A first sputtering process is then performed to form a metal layer 114 on a surface of the silicon nitride layer 108. The metal layer 114 may be a tungsten (W) layer, a chrome (Cr) layer, or another conductive metal layer.

Figure 9:
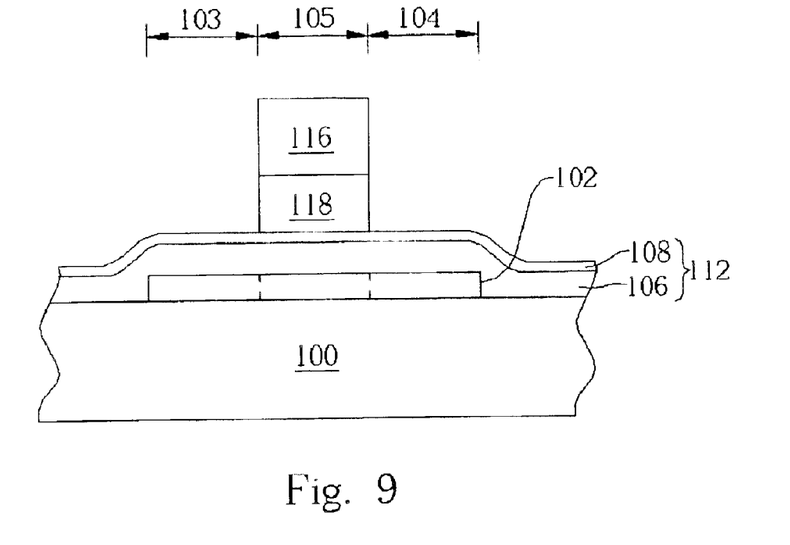

As shown in FIG. 9, a photoresist layer (not shown) is formed on the surface of the insulation substrate 100. A photolithography process is thereafter performed to define a gate pattern 116 in the photoresist layer (not shown). The gate pattern 116 is on top of the channel region 105. After that, a dry etch process is performed to remove portions of the metal layer 114 to form a gate 118 on top of the silicon nitride layer 108.

Figure 10:
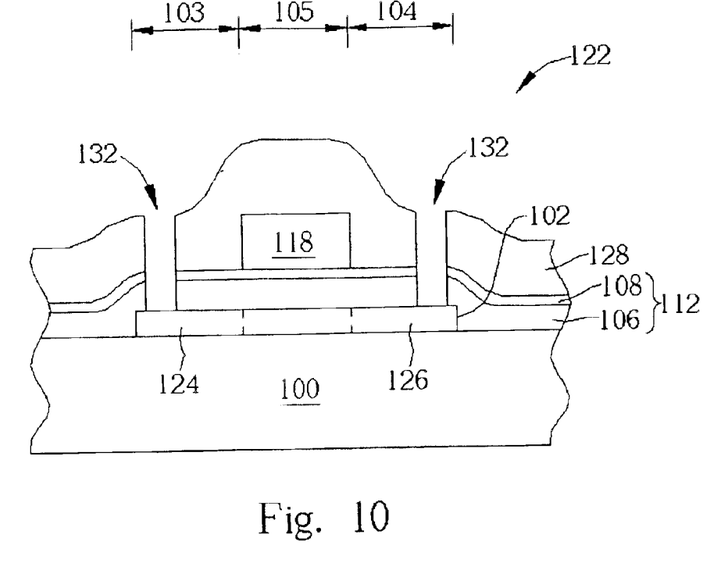

After removing the gate pattern 116, an ion implantation process is then performed to form a source 124 and a drain 126 of the low temperature polysilicon thin film transistor 122 in the source region 103 and in the drain region 104 in the polysilicon layer 102, respectively, by utilizing the gate 118 as a mask as shown in FIG. 10. In consideration of the application of the thin film transistor (TFT), the series resistance of the source/drain must be low. An activation process is thus necessarily performed after the ion implantation process to highly activate the dopants in the source 124 and the drain 126. The activation process not only moves the ions to the correct lattice sites, but also repairs the lattice defects incurred from the ion implantation process to complete the fabrication of the low temperature polysilicon thin film transistor 122.

After completing the low temperature polysilicon thin film transistor 122, a dielectric layer 128 is deposited. The dielectric layer 128 may be a single-layered dielectric layer or a composite-layered dielectric layer. Finally a photo-etching-process (PEP) is performed to form a contact hole 132 from the dielectric layer 128 and the composite gate insulating layer 112, on top of the source region 103 and the drain region 104, extending to the source 124 and the drain 126, respectively. The contact hole 132 is filled with conductive materials to electrically connect the source 124 and the drain 126 to the electrode of the capacitor and the signal line respectively, according to the circuit design.

Please refer to FIG. 11 to FIG. 14, FIG. 11 to FIG. 14 are schematic diagrams of fabricating a low temperature polysilicon thin film transistor 226 according to a second preferred embodiment of the present invention. The difference between the first preferred embodiment and the second preferred embodiment is that the low temperature polysilicon thin film transistor 122 in the first preferred embodiment is a top gate structure and the low temperature polysilicon thin film transistor 226 in the second preferred embodiment is a bottom gate structure.

Figure 11:
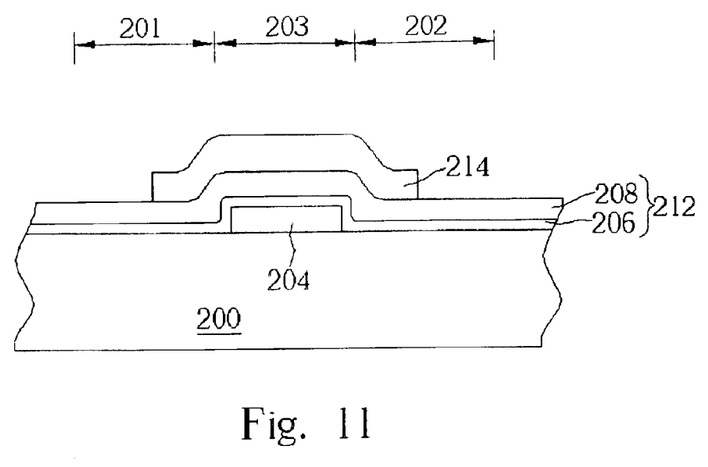
FIG. 11 to FIG. 14 are schematic diagrams of fabricating a low temperature polysilicon thin film transistor according to a second preferred embodiment of the present invention.

As shown in FIG. 11, the present invention low temperature polysilicon thin film transistor 226 is fabricated on an insulation substrate 200. The insulation substrate 200, composed of substantially transparent materials, may be a glass substrate or a quartz substrate. A predetermined source region 201, a predetermined drain region 202, and a predetermined channel region 203 are comprised on a surface of the polysilicon layer 102. A first sputtering process is performed first to form a first metal layer (not shown) on a surface of the insulation substrate 200. The first metal layer (not shown) may be a tungsten (W) layer, a chrome (Cr) layer, or another conductive metal layer. Then a first photo-etching-process-1 (PEP-1) is performed to form a gate 204 on the surface of the insulation substrate 200. The gate 204 is on top of the predetermined channel region 203.

Then, a first plasma enhanced chemical vapor deposition (PECVD) process is performed by inputting silane, ammonia ($NH_3$), and nitrogen ($N_2$) to form a silicon nitride layer ($SiN_x$ layer, $1.0<x<1.6$) 206, also called a silane-based silicon nitride layer ($SiH_4$-based $SiN_x$ layer) and having a thickness of 100~500 angstrom (Å), on a surface of the gate 204 and on the surface of the insulation substrate 200. A second plasma enhanced chemical vapor deposition process is thereafter performed. By inputting tetra-ethyl-ortho-silicate (TEOS) and oxygen, a tetra-ethyl-ortho-silicate based silicon oxide layer (TEOS-based $SiO_x$ layer, where $x \approx 2$), also called a silicon oxide layer ($SiO_x$ layer) 208 and having a thickness of 500~1200 angstrom (Å), is formed on a surface of the silicon nitride layer 206. The silicon nitride layer 206 and the silicon oxide layer 208 compose a composite gate insulating layer 212. The first plasma enhanced chemical vapor deposition process and the second plasma enhanced chemical vapor deposition process are performed in a single wafer type chamber continuously or in different single wafer type chambers.

Since the dielectric constant for the silicon nitride layer 206 is much higher than the dielectric constant for the silicon oxide layer 208, the second preferred embodiment of the present invention can effectively avoid the overly high capacitance value of the gate insulating layer 212 by adjusting the thickness for silicon oxide layer 208 to be greater than the silicon nitride layer 206.

After that, an amorphous silicon thin film (α-Si thin film, not shown) is formed on a surface of the silicon oxide layer 208. Then, an excimer laser annealing (ELA) process is performed to re-crystallize the amorphous silicon thin film (not shown) into a polysilicon layer 214.

Similarly, the amorphous silicon thin film is melted and re-crystallized rapidly through the absorption of the deep ultraviolet light during the excimer laser annealing process to keep the insulation substrate 200 at a low temperature. In addition, all of the parameters during the amorphous silicon thin film deposition process need to be strictly controlled to form the amorphous silicon thin film with low hydrogen content, high thickness uniformity, and low surface roughness.

Figure 12:
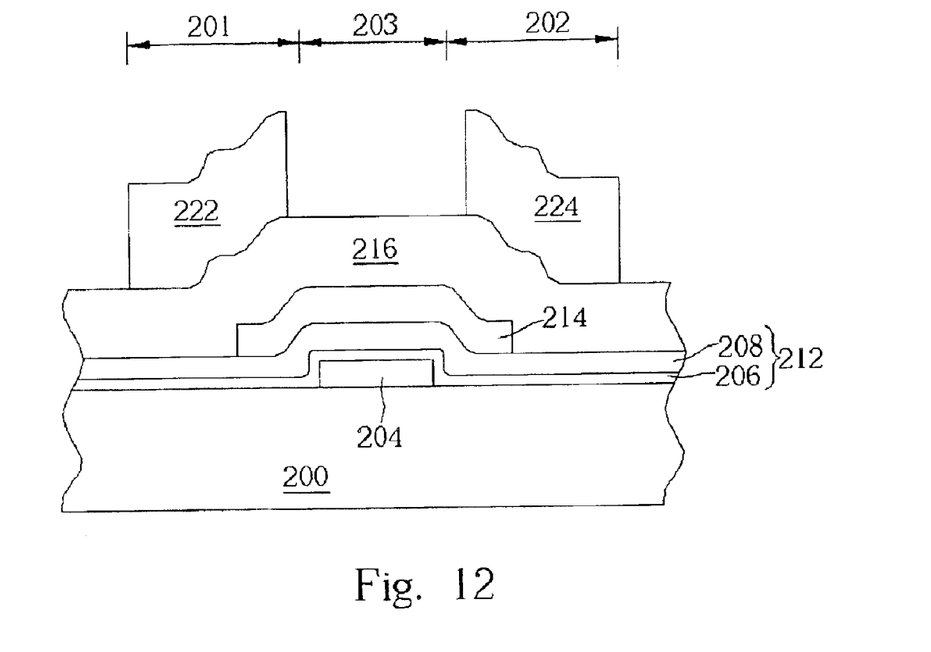
Figure 13:
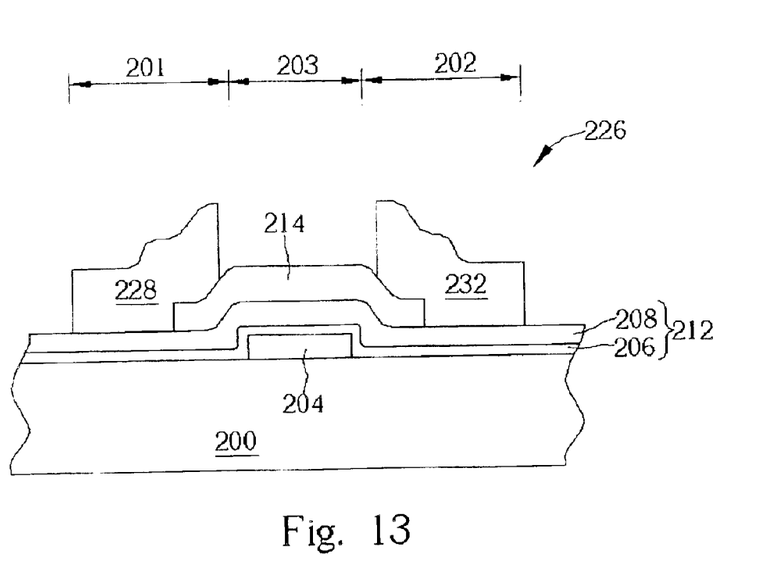

As shown in FIG. 12, a second sputtering process is performed to form a second metal layer 216 on a surface of the polysilicon layer 216 and on the surface of the silicon oxide layer 208. The second metal layer (not shown) may be a tungsten (W) layer, a chrome (Cr) layer, or other conductive metal layer. A photoresist layer (not shown) is thereafter formed on the surface of the insulation substrate 200. After that, a photolithography process is performed to define a source pattern 222 and a drain pattern 224 in the photoresist layer (not shown). As shown in FIG. 13, a dry etch process is then performed to form a source 228 and a drain 232 of the low temperature polysilicon thin film transistor 226 in the second metal layer 216. The source 228 is on top of the predetermined source region 201, portions of the gate insulating layer 212, and the polysilicon layer 214 and the drain 232 is on top of the predetermined drain region 202, portions of the gate insulating layer 212, and the polysilicon layer 214.

Figure 14:
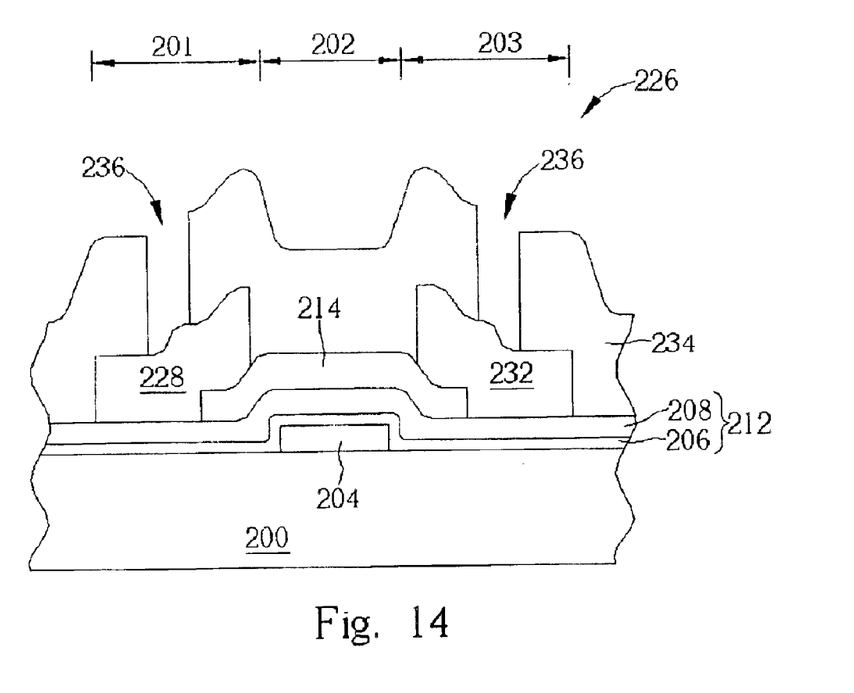

After removing the source pattern 222 and the drain pattern 224, a dielectric layer 234 is finally deposited as shown in FIG. 14. Finally a second photo-etching-process (PEP-2) is performed to form a contact hole 236 from the dielectric layer 234 on top of the predetermined source region 201 and the predetermined drain region 202 extending to the source 228 and the drain 232, respectively. The contact hole 236 is filled with conductive materials to electrically connect the source 228 and the drain 232 to the electrode of the capacitor and the signal line respectively, according to the circuit design. The dielectric layer 234 may be a single-layered dielectric layer or a composite-layered dielectric layer.

The method of fabricating the low temperature polysilicon thin film transistor according to the present invention is to utilize a plasma enhanced chemical vapor deposition process and tetra-ethyl-ortho-silicate to form a silicon oxide layer. Then utilize another plasma enhanced chemical vapor deposition process to form a silicon nitride layer (or vice versa, depends on whether the present invention low temperature polysilicon thin film transistor is a top gate structure or a bottom gate structure). Therefore, not only the Si—SiO$_x$ interface property can be improved to effectively reduce the concentration of the interface trapped charges in the Si—SiO$_2$ interface, the better step coverage ability, the better barrier ability to moisture and metal ions, and a higher breakdown voltage is obtained. As a result, the performance and the reliability of device are effectively improved.

In comparison with the prior art method of fabricating the gate insulating layer of the low temperature polysilicon thin film transistor, the present invention method utilizes a plasma enhanced chemical vapor deposition process and tetra-ethyl-ortho-silicate to form a silicon oxide layer. Then another plasma enhanced chemical vapor deposition process is utilized to form a silicon nitride layer (or vice versa). The silicon oxide layer and the silicon nitride layer compose the composite gate insulating layer of the present invention low temperature polysilicon thin film transistor. The silicon oxide thin film, deposited by inputting tetra-ethyl-ortho-silicate, has a superior interface property than the silane-based silicon oxide thin film. The concentration of the interface trapped charges in the Si—SiO$_x$ interface is thus reduced. The flat band voltage is not readily changed to improve the stability of the threshold voltage of the low temperature polysilicon thin film transistor greatly. In addition, the tetra-ethyl-ortho-silicate based silicon oxide layer has a better step coverage ability than the silane-based silicon oxide thin film. In comparison with the silicon oxide thin film in the prior art, the gate insulating layer in the present invention low temperature polysilicon thin film transistor has a better barrier ability to moisture and metal ions and a higher breakdown field strength due to the silicon nitride thin film. Therefore, the performance and the reliability of device are effectively improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming at least one low temperature polysilicon thin film transistor (LTPS TFT) on an insulating substrate, the method comprising:

forming at least one polysilicon layer (poly-Si layer) on a surface of the insulating substrate, a source region, a drain region, and a channel region of the low temperature polysilicon thin film transistor being comprised on a surface of the polysilicon layer;

performing a first plasma enhanced chemical vapor deposition (PECVD) process and a second plasma enhanced chemical vapor deposition process to sequentially form a tetra-ethyl-ortho-silicate based silicon oxide layer (TEOS-based SiO$_x$ layer, where x≈2) and a silicon nitride layer (SiN$_x$ layer, where 1.0<x<1.6) on the channel region, the tetra-ethyl-ortho-silicate based silicon oxide layer situated on the surface of the polysilicon layer and the silicon nitride layer form a composite gate insulating layer; and forming a gate electrode on the composite gate insulating layer.

2. The method of claim 1 wherein the insulating substrate is a glass substrate.

3. The method of claim 1 wherein the insulating substrate is a quartz substrate.

4. The method of claim 1 wherein the method for forming the polysilicon layer further comprises the following steps:

performing a sputtering process to form an amorphous silicon layer (α-Si layer) on the surface of the insulating substrate; and performing an annealing process to re-crystallize the amorphous silicon layer to the polysilicon layer.

5. The method of claim 4 wherein the annealing process is an excimer laser annealing (ELA) process.

6. The method of claim 1 wherein the first plasma enhanced chemical vapor deposition process and the second plasma enhanced chemical vapor deposition process are performed in a single wafer type chamber continuously.

7. The method of claim 1 wherein the first plasma enhanced chemical vapor deposition process and the second plasma enhanced chemical vapor deposition process are performed in different single wafer type chambers.

8. The method of claim 1 wherein the tetra-ethyl-ortho-silicate based silicon oxide layer in the composite gate insulating layer is used to improve the interface property between the polysilicon layer and the composite gate insulating layer.

9. The method of claim 1 wherein the silicon nitride layer in the composite gate insulating layer is used to enhance the barrier ability of the composite gate insulating layer to moisture and metal ions.

10. The method of claim 1 wherein the thickness of the tetra-ethyl-ortho-silicate based silicon oxide layer is much greater than the thickness of the silicon nitride layer.

11. The method of claim 10 wherein the thickness of the tetra-ethyl-ortho-silicate based silicon oxide layer is much greater than the thickness of the silicon nitride layer to effectively reduce the parasitic capacitance.

12. The method of claim 10 wherein the thickness of the tetra-ethyl-ortho-silicate based silicon oxide layer is approximately 500~1200 angstrom (Å), the thickness of the silicon nitride layer is approximately 100~500 angstrom (Å).

13. The method of claim 1 wherein the material composition of the gate electrode is tungsten (W).

14. The method of claim 1 wherein the material composition of the gate electrode is chrome (Cr).

15. The method of claim 1 wherein an ion implantation process is performed by utilizing the gate electrode as a mask after forming the gate electrode to form a source electrode and a drain electrode in the polysilicon layer in the source region and in the drain region, respectively.

16. The method of claim 15 wherein an activation process is performed after the ion implantation process to activate the dopants in the source electrode and the drain electrode.

17. A method of forming a gate insulating layer of a low temperature polysilicon thin film transistor (LTPS TFT), the method comprising:

forming a patterned polysilicon layer (poly-Si layer);

performing a first plasma enhanced chemical vapor deposition (PECVD) process to directly form a first dielectric layer composed of tetra-ethyl-ortho-silicate based silicon oxide (TEOS-based $SiO_x$, where x≈2) on a surface of the polysilicon layer;

performing a second plasma enhanced chemical vapor deposition process to directly form a second dielectric layer composed of silicon nitride ($SiN_y$, where 1.0<y<1.6) on a surface of the first dielectric layer; and forming a patterned gate electrode on a surface of the second dielectric layer directly;

wherein the gate insulating layer is composed of the first dielectric layer and the second dielectric layer.

18. The method of claim 17 wherein the method for forming the polysilicon layer further comprises the following steps:

performing a sputtering process to form an amorphous silicon layer (α-Si layer); and performing an annealing process to re-crystallize the amorphous silicon layer to the polysilicon layer.

19. The method of claim 18 wherein the annealing process is an excimer laser annealing (ELA) process.

20. The method of claim 17 wherein the first plasma enhanced chemical vapor deposition process and the second plasma enhanced chemical vapor deposition process are performed in a single wafer type chamber continuously.

21. The method of claim 17 wherein the first plasma enhanced chemical vapor deposition process and the second plasma enhanced chemical vapor deposition process are performed in different single wafer type chambers.

22. The method of claim 17 wherein the thickness of the first dielectric layer is approximately 500~1200 angstrom (Å) and the thickness of the second dielectric layer is approximately 100~500 angstrom (Å).

23. The method of claim 17 wherein the material composition of the gate electrode is tungsten (W).

24. The method of claim 17 wherein the material composition of the gate electrode is chrome (Cr).

25. The method of claim 17 wherein the first dielectric layer in the gate insulating layer is used to improve the interface property between the polysilicon layer and the gate insulating layer, the second dielectric layer in the gate insulating layer is used to enhance the barrier ability of the gate insulating layer to moisture and metal ions.

26. A method of forming a gate insulating layer of a low temperature polysilicon thin film transistor (LTPS TFT), the method comprising:

forming a patterned gate electrode;

performing a first plasma enhanced chemical vapor deposition (PECVD) process to directly form a first dielectric layer composed of silicon nitride ($SiN_y$, where 1.0<y<1.6) on a surface of the gate electrode;

performing a second plasma enhanced chemical vapor deposition process to directly form a second dielectric layer composed of tetra-ethyl-ortho-silicate based silicon oxide (TEOS-based $SiO_x$, where x≈2) on a surface of the first dielectric layer; and forming a patterned polysilicon layer (poly-Si layer) on a surface of the second dielectric layer directly;

wherein the gate insulating layer is composed of the first dielectric layer and the second dielectric layer.

27. The method of claim 26 wherein the material composition of the gate electrode is tungsten (W).

28. The method of claim 26 wherein the material composition of the gate electrode is chrome (Cr).

29. The method of claim 26 wherein the first plasma enhanced chemical vapor deposition process and the second plasma enhanced chemical vapor deposition process are performed in a single wafer type chamber continuously.

30. The method of claim 26 wherein the first plasma enhanced chemical vapor deposition process and the second plasma enhanced chemical vapor deposition process are performed in different single wafer type chambers.

31. The method of claim 26 wherein the thickness of the first dielectric layer is approximately 100~500 angstrom (Å) and the thickness of the second dielectric layer is approximately 500~1200 angstrom (Å).

32. The method of claim 26 wherein the method for forming the polysilicon layer further comprises the following steps:

performing a sputtering process to form an amorphous silicon layer (α-Si layer); and performing an annealing process to re-crystallize the amorphous silicon layer to the polysilicon layer.

33. The method of claim 32 wherein the annealing process is an excimer laser annealing (ELA) process.

34. The method of claim 26 wherein the first dielectric layer in the gate insulating layer is used to enhance the barrier ability of the gate insulating layer to moisture and metal ions, the second dielectric layer in the gate insulating layer is used to improve the interface property between the polysilicon layer and the gate insulating layer.

* * * * *